(12) United States Patent
Charlon

(10) Patent No.: US 8,427,797 B2
(45) Date of Patent: Apr. 23, 2013

(54) ESD NETWORKS FOR SOLDER BUMP INTEGRATED CIRCUITS

(75) Inventor: Oliver Charlon, San Francisco, CA (US)

(73) Assignee: NXP B.V., Eindhoven (NL)

( * ) Notice: Subject to any disclaimer, the term of this patent is extended or adjusted under 35 U.S.C. 154(b) by 259 days.

(21) Appl. No.: 12/933,786

(22) PCT Filed: Mar. 20, 2009

(86) PCT No.: PCT/IB2009/051187
§ 371 (c)(1),
(2), (4) Date: Sep. 21, 2010

(87) PCT Pub. No.: WO2009/118674
PCT Pub. Date: Oct. 1, 2009

(65) Prior Publication Data
US 2011/0019320 A1 Jan. 27, 2011

Related U.S. Application Data

(60) Provisional application No. 61/038,743, filed on Mar. 22, 2008.

(51) Int. Cl.
*H02H 9/00* (2006.01)
*H02H 1/00* (2006.01)
*H02H 1/04* (2006.01)
*H02H 3/22* (2006.01)
*H02H 9/06* (2006.01)

(52) U.S. Cl.
USPC .............................. 361/56; 361/118

(58) Field of Classification Search .................. 361/56
See application file for complete search history.

(56) References Cited

U.S. PATENT DOCUMENTS

| 7,274,048 | B2 * | 9/2007 | Wu ........................... 257/173 |
| 7,649,723 | B2 * | 1/2010 | Chiu et al. ................. 361/56 |
| 7,808,075 | B1 * | 10/2010 | Cheng et al. .............. 257/528 |
| 2003/0235019 | A1 * | 12/2003 | Ker et al. .................. 361/56 |
| 2004/0106228 | A1 | 6/2004 | Wu |
| 2004/0119159 | A1 | 6/2004 | Takahashi |
| 2005/0051881 | A1 | 3/2005 | Chen et al. |
| 2006/0075368 | A1 | 4/2006 | Bakir et al. |
| 2007/0187809 | A1 | 8/2007 | Khorram |
| 2009/0097175 | A1 * | 4/2009 | Chiu et al. ................. 361/56 |

OTHER PUBLICATIONS

International Search Report for Application PCT/IB2009/051187 (Mar. 20, 2009).

* cited by examiner

*Primary Examiner* — Dharti Patel

(57) ABSTRACT

Semiconductor dice (100, 200) of integrated circuit chips are provided with solder bump pads (130, 230) distributed over active areas of the dice to supply the I/O interconnects without including peripheral wire bond pads. The dice are further provided with protective ESD structures (140p/140i, 240p/240i) arranged in a network that includes ESD structures that extend into the interior areas of the dice. This allows the ESD structures to be placed proximate to respective power and ground connections, and positioned to reduce an average interconnect length between interior bump pads and the ESD structures relative to an average path length between the interior bump pads and the die peripheral area.

15 Claims, 2 Drawing Sheets

ESD NETWORKS FOR SOLDER BUMP INTEGRATED CIRCUITS

FIELD OF THE INVENTION

The present invention relates generally to integrated circuits and semiconductor dice that include protective ESD structures and solder bumps for external interconnecting.

BACKGROUND OF THE INVENTION

In conventional integrated circuit technology, interconnections are made using wire bond pads arranged in one or more rows around the periphery of the semiconductor die, or using solder bump pads arranged in an array over the circuit area of the die. The trend in the electronics industry is to increase reliance on solder bump connections. Often, existing circuit designs that originally utilized wire bonding are retrofitted for solder bumps or are made with the solder bumps as an option in addition to the conventional wire bonding assembly.

Together with the provided wire bond pads, there is circuitry that protects the interior parts of the circuit from electrostatic discharge (ESD) events, for example that can occur during handling of the circuit die. ESD can result in a voltage peak of about 2,000 volts or more, which can result in a discharge of a current of about 1.5 amperes over a resistance of about 1,500 ohms. The protective ESD circuits are typically located between the input/output (I/O) bond pads around the periphery of the die and the transistor gates or other electronic components to which the pads are electrically connected. The ESD circuits provide a path from the I/O pads to a ground pad, or to a power or bias voltage path for the die. This electrical path is designed to be actuated by a high voltage, such as an electrostatic discharge, that occurs at for instance input or output pads of a die.

Generally, the ESD structures are configured in a ring placed near the edge of the circuit and in situ with the peripheral bond pads. This allows the signal path from the circuit edge to the ESD to be made sufficiently short and strong. When such semiconductor dice are also provided with bump pads for use in flip-chip configuration, bump pads distributed over the interior area are routed to the ESD ring, resulting in long interconnect lengths and often complex routing that can take up die area.

SUMMARY OF THE INVENTION

Various aspects of the present invention are directed to integrated circuit chips that include semiconductor dice having an interior area bounded by a peripheral area, such semiconductor dice including at least one functional domain located in the die interior area and I/O circuitry providing I/O interconnects for the at least one functional domain. In accordance with various aspects of the present invention, the I/O circuitry includes a plurality of solder bump pads without including peripheral wire bond pads, and at least a portion of the bump pads are interior bump pads distributed over the die interior area. An ESD network is provided to protect components of the die from electrostatic discharge, the ESD network including a plurality of ESD structures located in the die interior area, each of the ESD structures placed proximate to respective power and ground connections, and positioned to reduce an average interconnect length between the interior bump pads and the ESD structures relative to an average path length between the interior bump pads and the die peripheral area.

Various aspects of the present invention are further directed to methods for designing integrated circuit chips including a semiconductor die having an interior area bounded by a peripheral area and at least one functional domain located in the die interior area. Such methods include distributing solder bump pads over a surface of the die to provide the I/O interconnects for the at least one functional domain without including peripheral wire bond pads, at least a portion of the bump pads being interior bump pads distributed over the die interior area. Such methods further includes providing an ESD network of ESD structures to protect components of the die from electrostatic discharge, at least a portion of the ESD structures located in the die interior area, each of the ESD structures being placed proximate to respective power and ground connections and being positioned to reduce an average interconnect length between the interior bump pads and the ESD structures relative to an average path length between the interior bump pads and the die peripheral area.

The above summary is not intended to describe each embodiment or every implementation of the present disclosure. The Figures and detailed description that follow more particularly exemplify various embodiments.

BRIEF DESCRIPTION OF THE DRAWINGS

The invention may be more completely understood in consideration of the following detailed description of various embodiments of the invention in connection with the accompanying drawings, in which.

Figure 1:
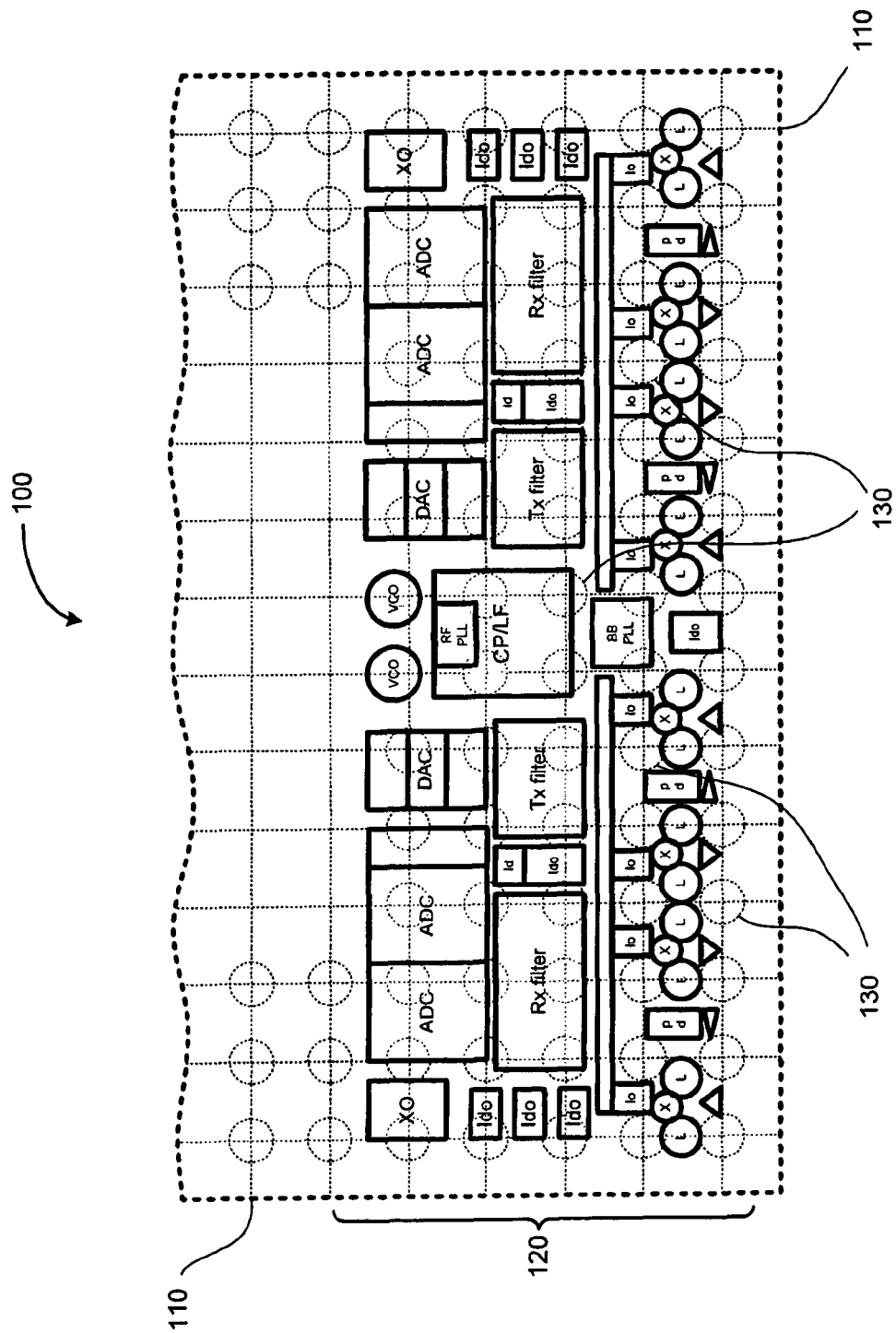
FIG. 1 illustrates a portion of a semiconductor die in which aspects of the present invention can be implemented.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention including aspects defined by the appended claims.

DETAILED DESCRIPTION OF THE EMBODIMENTS

Embodiments of the present invention relate to integrated circuits and semiconductor dice that include at least one functional domain in the die interior area and I/O circuitry providing I/O interconnects for the at least one functional domain, the I/O circuitry including a plurality of solder bump pads without including peripheral wire bond pads, at least a portion of the bump pads being interior bump pads distributed over the die interior area. In accordance with certain embodiments, ICs and dice of the present invention further include an ESD network to protect components of the die from electrostatic discharge, the ESD network including a plurality of ESD structures located in the die interior area, each of the ESD structures placed proximate to respective power and ground connections and positioned to reduce an average interconnect length between the interior bump pads and the ESD structures relative to an average path length between the interior bump pads and the die peripheral area.

In accordance with certain embodiments, the present invention takes advantage of reductions in interconnection length and smaller package footprint that can be provided by bump pad bonding as compared with wire bonding. Bump pad bonding can provide points of I/O interconnect across the surface of the die, reducing the interconnect distance to the functional domains. In the present invention, it is recognized that removing the superfluous wire bond pads allows the ESD structures to be moved away from the die periphery as desired, for example to position the ESD structures closer to sources of power and ground.

Various embodiments of the present invention can be particularly suitable for designing integrated circuits intended to be connected via solder bumps over the whole area of the die (as opposed to being wire bonded or connected via solder bumps over the peripheral bond pads). For self-contained systems-on-chip (SoC) systems, the trend in the industry is to connect via solder bump pads to provide advantages of smaller footprint packaging. While it may be illustrative to consider various aspects of the present invention in terms of implementation within in a radio-baseband SoC system (such as illustrated in the appended drawings), it will be appreciated from the descriptions provided herein that aspect of the present invention may be useful in other environments now known or later developed. For example, any monolithic IC technology is a candidate for use in the present invention, including any silicon-based (or other semiconductor) technology, any analog, digital, RF, mixed signal, SoC, and so forth.

In accordance with certain embodiments, the present invention provides for the removal of superfluous peripheral wire bond pads, physical rearrangement of ESD circuitry with the freedom to place ESD cells within the semiconductor die in the interior of the circuit, and thus desirably closer to power and ground connections which simplifies and shortens interconnect routing and reduces the overall die area. In accordance with certain embodiments, the bump pads provide all the I/O's for the circuit, and no peripheral wire bond pads are used. By removing the unused wire bond pads, obstacles in routing signals and power supplies around the die are removed. The circuitry otherwise associated with the (now removed) wire bond pads, such as ESD structures and I/O's, can thus be moved away from the circuit edge, resulting in simplified routing of the solder bumps. Placing the bond pad based ESD and I/O cells in the interior of the circuit in accordance with certain embodiments of the present invention thus improves the interconnect routing.

Removing the peripheral bond pads allows ESD circuitry to be placed inside the circuit rather than being located only around the circuit edge. As such, the ESD circuitry may be positioned to reduce interconnect lengths between the ESD devices and the solder bumps (distributed over the surface of the die), particularly as compared to the routing from the interior solder bumps out to the edges of the circuit as previously required. For example, average interconnect lengths between the ESD devices and the solder bump pads in accordance with certain embodiments may be no more than about three times the bump pad pitch, or even no more than about two times the bump pad pitch. Depending on circuit dimensions, such average interconnect lengths may translate to about 50 to 150 microns.

In certain embodiments of the present invention, the solder bump signals are routed by relatively short leads to strategically-placed ESD structures, for example, so that the lead lengths are shortened as compared to leads that would otherwise be required from the solder bumps to the circuit edge. From the ESD structures, the signal continues to its intended destination in the circuit. Strong power and ground routing for the ESD structures may be suitably provided in the interior area of the die away from the circuit edge so that the ESD structures can be positioned desirably where strong power and ground connections are available and in conjunction with the reduction of the signal routing length. Arranging ESD networks in accordance with certain embodiments of the present invention can result in reduced circuit area and complexity, and in increased flexibility in positioning of the ESD structures. For example, a typical state-of-the-art bond pad pitch (center to center distance) is about 40 to 50 microns. Such dimensions can accommodate interior ESD structures that are 10 to 15 microns center-to-center, and the ESD structures can be stacked as needed.

Generally, it is desirable to provide additional room for ESD structures due to the often large and complex ESD circuits (such as ESD crowbar circuits) used to protect the various power supplies. For a robust IC design, it is desirable to protect every power supply going to a solder bump pad using at least one and often several such ESD circuits, which can be space intensive.

FIG. 1 illustrates a portion of a semiconductor die 100 that can be used to implement embodiments of the present invention. Die 100 has a periphery 110 and I/O interconnect circuitry that includes bump pads 130 distributed in an array across the surface of the die. A functional domain 120 is shown, for example an RF macro, which includes various circuit element components. The circuit elements are shown in solid lines and the bump pads 130 are shown in dashed lines to indicate that the bump pads 130 are located on top of the circuitry of the die 100. The die 100 includes no bond pads around the periphery 110 so that all the I/O interconnects are provided by the solder bump pads 130. The solder bumps pads 130 are connected to their respective circuit elements by an additional metal layer called the redistribution layer (RDL), which is not shown in the drawings.

Figure 2:
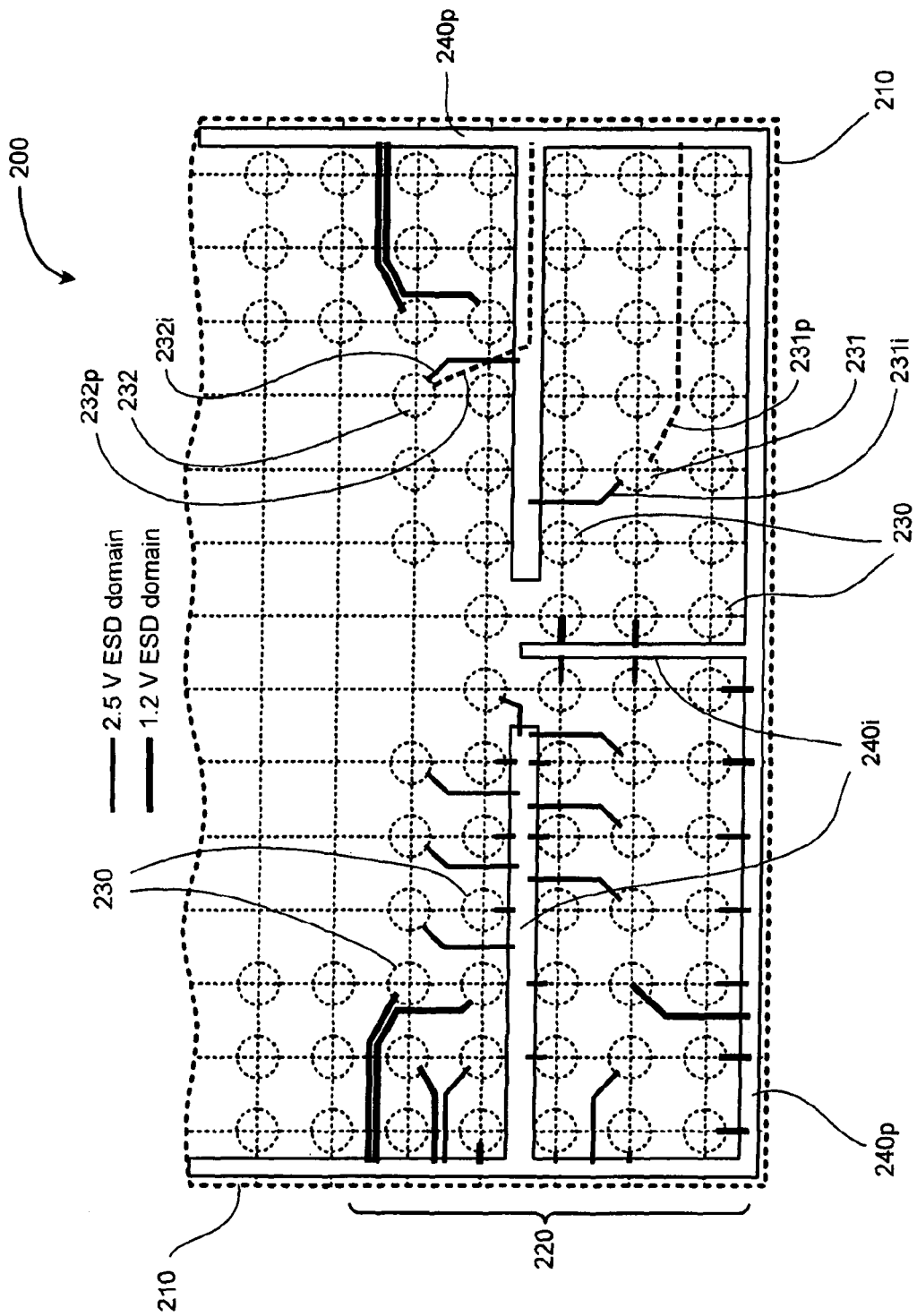
FIG. 2 illustrates a portion of a semiconductor die that includes an ESD network and I/O interconnects in accordance with an embodiment of the present invention.

FIG. 2 illustrates a portion of a semiconductor die 200 that includes an ESD network in accordance with an embodiment of the present invention. Die 200 has a periphery 210 and I/O interconnect circuitry that includes bump pads 230 distributed in an array across the surface of the die. A functional domain 220 is shown, for example an RF macro, which includes various circuit element components that are not shown in order to better illustrate the ESD network. The ESD network includes an ESD ring 240p arranged around the die periphery 210, an interior ESD structures 240i that extend into the die interior. Any suitable ESD structures may be used, and the choice of ESD structure is generally based on what is suitable or desirable for the requirements of the IC product being implemented. For example, FIG. 2 illustrates at least two different ESD domains, which are indicated by the width of the lead lines extending from different bump pads 230 to the ESD network. In exemplary constructions, the connections from the bump pads through the RDL layer (indicated by the heavy lines) and to the ESD devices are relatively short, and made as strong and robust as is practicable.

The die 200 includes no bond pads around the periphery 210 so that all the I/O interconnects are provided by the solder bump pads 230. Because there are no peripheral wire bond pads, there is no need to route the interior bump pads to the peripheral ESD ring. As such, the interior bump pads may be routed to interior ESD structures as indicated in FIG. 2. For simplicity, most of the bump pad connections to the ESD structures are shown in only one half of the functional domain 220 (left half of FIG. 2). It should be noted that the routing shown is merely an example to illustrate features of the present invention, and that any desired routing can be implemented. Indeed, certain embodiments of the present invention offer increased flexibility in determining routing.

As can be appreciated from FIG. 2, the average interconnect length from the bump pads to the ESD network can be made much shorter that what would otherwise be the case if the bump pads were routed only to an ESD ring around the die periphery. For example, bump pad 231 is shown to be routed to an interior ESD structure via lead 231i, the length of which can be compared to alternative routing 231p to the peripheral ESD ring. The alternative routing 231p is an example of the routing needed in the case that no interior ESD structures were provided. For further illustration, bump pad 232 is shown connected to an interior ESD structure via lead 232i, the length of which can be compared to alternative routing 232p to the peripheral ESD ring. As these examples shown, the reduction in interconnect path length is particularly striking for the most interior bump pads. As such, not only is the average interconnect path length reduced, but die area can be saved because it is not needed for routing from the interior bump pads to the die periphery.

It will be recognized that the circuits described herein may be manufactured using standard processes and techniques. While the present invention has been described above and in the claims that follow, those skilled in the art will recognize that many changes may be made thereto without departing from the spirit and scope of the present invention.

The invention claimed is:

1. An integrated circuit chip including a semiconductor die having an interior area bounded by a peripheral area, the semiconductor die comprising:
    at least one functional domain located in the die interior area;
    I/O circuitry providing I/O interconnects for the at least one functional domain, the I/O circuitry including a plurality of solder bump pads without including peripheral wire bond pads, at least a portion of the bump pads being interior bump pads distributed over the die interior area; and
    an ESD network to protect components of the die from electrostatic discharge, the ESD network including a plurality of ESD structures located in the die interior area, each of the ESD structures placed proximate to respective power and ground connections, and positioned to reduce an average interconnect length between the interior bump pads and the ESD structures relative to an average path length between the interior bump pads and the die peripheral area.

2. The integrated circuit chip of claim 1, wherein the at least one functional domain includes an RF macro.

3. The integrated circuit chip of claim 1, wherein the at least one functional domain includes a digital macro.

4. The integrated circuit chip of claim 1, wherein the ESD network further includes an ESD ring positioned near the die periphery and interior ESD structures positioned in the die interior area.

5. The integrated circuit chip of claim 1, wherein the I/O interconnects are routed to the ESD through a metal redistribution layer of the die.

6. The integrated circuit chip of claim 1, wherein the I/O circuitry provides solder bump pad I/O interconnects for the entire die without including peripheral wire bond pads.

7. The integrated circuit chip of claim 1, wherein the integrated circuit chip is implemented as a SoC.

8. The integrated circuit chip of claim 1, wherein the integrated circuit chip is implemented as a radio-baseband SoC.

9. The integrated circuit chip of claim 1, wherein the average interconnect length between the interior bump pads and the ESD structures is no more than three times the average spacing between bump pads.

10. The integrated circuit chip of claim 1, wherein the average interconnect length between the interior bump pads and the ESD structures is no more than two times the average spacing between bump pads.

11. The integrated circuit chip of claim 1, wherein the average interconnect length between the interior bump pads and the ESD structures is in a range of about 50 microns to 150 microns.

12. The integrated circuit chip of claim 1, wherein the interior bump pads distributed over the die interior area are electrically connected via leads to the plurality of ESD structures located in the die interior area.

13. The integrated circuit chip of claim 12, wherein the interior bump pads are electrically connected via leads to a respective one of the interior ESD structures to reduce an average interconnect length between the interior bump pads and the ESD network.

14. A method for designing an integrated circuit chip including a semiconductor die having an interior area bounded by a peripheral area and at least one functional domain located in the die interior area, the method comprising:
    distributing solder bump pads over a surface of the die to provide I/O interconnects for the at least one functional domain without including peripheral wire bond pads, at least a portion of the bump pads being interior bump pads distributed over the die interior area; and
    providing an ESD network of ESD structures to protect components of the die from electrostatic discharge, at least a portion of the ESD structures located in the die interior area, each of the ESD structures being placed proximate to respective power and ground connections and being positioned to reduce an average interconnect length between the interior bump pads and the ESD structures relative to an average path length between the interior bump pads and the die peripheral area.

15. An integrated circuit chip including a semiconductor die having an interior area bounded by a peripheral area, the semiconductor die comprising:
    at least one functional domain of circuitry located in the die interior area;
    I/O circuitry providing I/O interconnects for the at least one functional domain, the I/O circuitry including a plurality of solder bump pads without including peripheral wire bond pads, at least a portion of the bump pads being interior bump pads distributed over the die interior area; and
    an ESD network to protect components of the die from electrostatic discharge, the ESD network including an ESD ring arranged around the die periphery and interior ESD structures extending from the ESD ring into the die interior area for providing ESD protection thereto, the ESD ring and the ESD structures being positioned and configured to reduce an average interconnect length between the interior bump pads and the ESD network relative to an average path length between the interior bump pads and the die peripheral area.

\* \* \* \* \*